United States Patent

Forst et al.

[15] 3,676,741

[45] July 11, 1972

[54] SEMICONDUCTOR TARGET STRUCTURE FOR IMAGE CONVERTING DEVICE COMPRISING AN ARRAY OF SILVER CONTACTS HAVING DISCONTINUOUS NODULAR STRUCTURE

[72] Inventors: Steve Michael Forst; Horst Alfred Reinheimer, both of Reading, Pa.

[73] Assignee: Bell Telephone Laboratories, Incorporated, Murray Hill, N.J.

[22] Filed: Dec. 9, 1970

[21] Appl. No.: 96,352

[52] U.S. Cl. ....................317/234 R, 317/234 L, 317/234 N, 317/235 N, 29/589

[51] Int. Cl. ..........................................H01l 3/00, H01l 5/00

[58] Field of Search .............317/234, 235 L, 235 M, 235 N, 317/27; 310/9.6, 9.7; 29/589, 590

[56] References Cited

UNITED STATES PATENTS

| | | | |
|---|---|---|---|
| 2,392,429 | 1/1946 | Sykes | 310/9.6 X |
| 3,204,158 | 8/1965 | Schreiner et al. | 317/234 M |
| 3,403,284 | 9/1968 | Buck et al. | 317/235 |
| 3,457,475 | 7/1969 | Chen | 317/234 |
| 3,496,631 | 2/1970 | Chen | 317/234 |
| 3,497,774 | 2/1970 | Hornberger et al. | 317/234 |

FOREIGN PATENTS OR APPLICATIONS

| | | | |
|---|---|---|---|
| 1,361,875 | 4/1964 | France | 317/235 |

*Primary Examiner*—John W. Huckert
*Assistant Examiner*—Andrew J. James
*Attorney*—R. J. Guenther and Edwin B. Cave

[57] ABSTRACT

Conductive metal islands are applied over each diode region and the adjacent oxide to minimize adverse charge build up on the insulating layer of the target surface of a semiconductor diode array target structure. These conductive metal islands are made by the plating of silver from a silver nitrate and hydrofluoride bath. The process produces a deposited silver button having an irregular, somewhat nodular, configuration.

4 Claims, 2 Drawing Figures

INVENTORS
S. M. FORST
H. A. REINHEIMER
BY H W Lockhart
ATTORNEY

SEMICONDUCTOR TARGET STRUCTURE FOR IMAGE CONVERTING DEVICE COMPRISING AN ARRAY OF SILVER CONTACTS HAVING DISCONTINUOUS NODULAR STRUCTURE

BACKGROUND OF THE INVENTION

This invention relates to light sensitive storage devices, and more particularly to television camera tubes having semiconductor target structures.

The U.S. Pat. No. of Reynolds, 3,011,089, describes a light sensitive storage device that can be used as a television camera tube. The target or photosensitive element in this tube comprises a silicon semiconductor body having an array of PN junction diodes on one surface thereof.

Improvements to the basic configuration disclosed by Reynolds are described in U.S. Pat. No. 3,403,284 to Buck, Crowell and Gordon, and U.S. Pat. No. 3,419,746 to Crowell, Dalton, Gordon and Labuda. These improvement patents relate to coatings to be applied to the target surface for improving the performance of the device largely by controlling charge distribution and movement on the target surface. U.S. Pat. No. 3,403,284 in particular, proposes a conductive contact to overlay the PN junction diode face and adjacent insulated coating so as to effectively increase the area of capacitive coupling between each P type region and the N type substrate of the typical silicon target configuration.

In another disclosure relating to the provision of a conductive contact over the target diode surface the copending application of E. I. Gordon, Ser. No. 747,866, U.S. Pat. No. 3,575,823 filed on July 26, 1968 and assigned to the assignee hereof, proposes as an alternative to the original photolithographic technique, an electroplating process to deposit the conductive contacts on the target diode surfaces. Moreover, the foregoing application of Gordon discloses a variety of suitable metals to be utilized for this purpose including gold, nickel, cobalt, palladium and platinum group metals such as rhodium, osmium, iridium and ruthenium. Gordon also alludes to silver and copper but indicates that both of these metals have disadvantages.

In the case of the foregoing basically proposed metals their use for the purpose of conductive overlay contacts on silicon diode target arrays are not completely satisfactory from an electrical standpoint.

SUMMARY OF THE INVENTION

In accordance with this invention it has been found that conductive metal overlays on the diode surfaces of the target arrays are advantageously produced by an electroless plating process from a silver nitrate and hydrofluoride solution. The plating method is by chemical displacement using a bath comprising silver nitrate and buffered hydrofluoric acid, the latter of which includes ammonium bifluoride, and water. Depending upon the concentration of silver nitrate in the bath the plating times for producing suitable conductive contacts of silver may range from 1 to about 10 minutes.

Of particular moment in connection with the formation of silver conductive contacts in accordance with this invention is the physical configuration of the contacts so produced. Instead of a relatively smooth uniform contact which had been the standard sought heretofore the contacts produced by plating from the silver nitrate bath in accordance with this invention is of a relatively irregular, discontinuous configuration exhibiting a pile up or thickening around the rim of the contact where it overlies the adjoining oxide film. In particular, the contact structure, which may be characterized as nodular, provides an improved electrical response over that achieved with the smooth continuous contacts. Although the reasons for this improved response are not completely understood, it is believed the discontinuous structure of the silver contacts thus produced is advantageous from the standpoint of impingement and absorption of the electron beam upon the target surface. Moreover, the particular plating process reduces the erosion of the silicon surface over that suffered in other prior art plating processes.

Accordingly, a feature of this invention is a conductive overlay silver contact on the diode surface and the adjoining oxide film of a silicon target array which silver contact has a nodular, roughened and discontinuous configuration.

It is a further feature of the invention that such a contact structure is produced by electrochemical displacement from a silver nitrate-hydrofluoride bath.

BRIEF DESCRIPTION OF THE DRAWING

The invention and its objects and features will be more clearly understood from the following detailed description taken in conjunction with the drawing in which.

DETAILED DESCRIPTION

Figure 1:
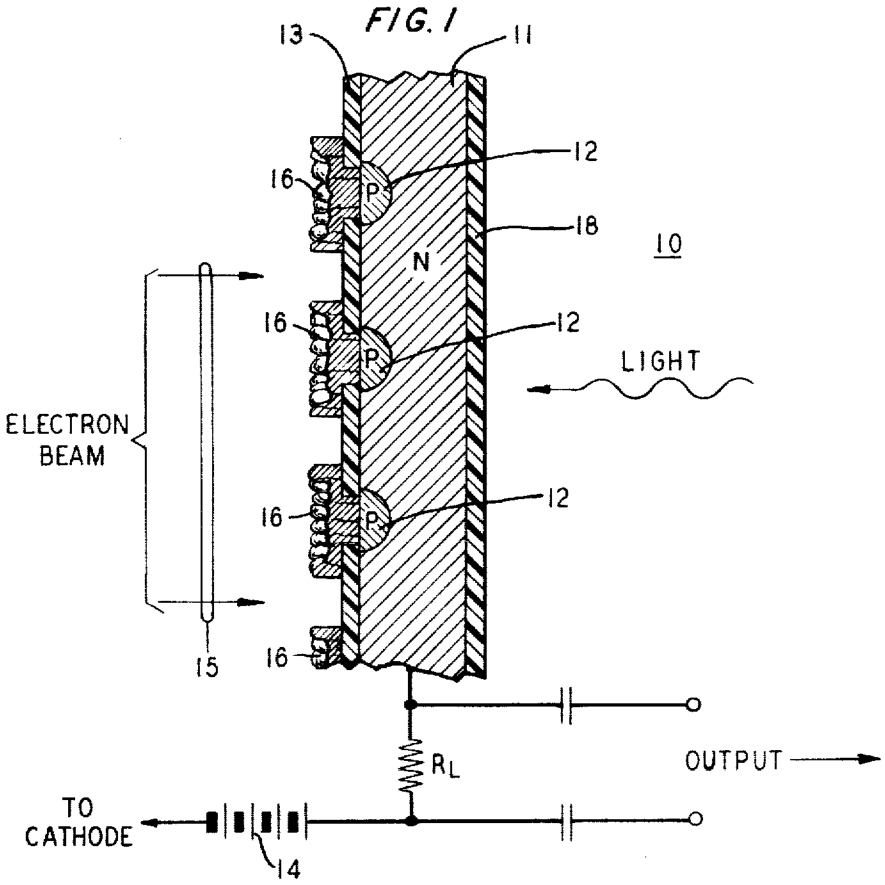
FIG. 1 is an enlarged view of part of a target structure of a television camera tube shown in cross section and schematically to illustrate in general the use of the invention.

FIG. 1 shows a portion of a silicon diode target array structure to indicate the general setting of the invention. The target structure 10 comprises an N type conductivity silicon substrate 11 having on one face thereof an array of equi-spaced P type conductivity zones 12 defining with the substrate PN junctions. The face of the device containing the P type zones 12 is covered with an oxide layer 13 except for the surfaces of the P type zones 12. On the surfaces of the P type zones 12 and overlying the adjoining insulative oxide layer 13 there are formed the metal conductive contacts 16 which enhance the capacitive coupling and thereby the sensitivity of the device. On the opposite face of the silicon body there is provided a silicon oxide film 18. As has been described in the above-noted patents a scanning electron beam 15 connected by way of a cathode, not shown, to a voltage source 14 scans the diode face of the device.

The particular process in accordance with this invention follows conventional fabrication of the silicon diode target array which is described in one form, for example, in the copending application of W. E. Beadle et al., Ser. No. 882,235, filed Dec. 4, 1969 and assigned to the assignee hereof. In a particular embodiment, following a final annealing step, the silicon body having the oxide mask 13 in place as indicated in FIG. 1 is mounted on a clean surface using a suitable adhesive such as glycol phthalate which may be heated to about 200° C. for use. Advantageously, the target element is mounted so as to provide adhesive coverage of the entire reverse side and edge of the device.

After the assembly has been blown clean with dry air or inert gas it is immersed quickly into a plating bath in which plating proceeds for sufficient time to produce the desired metal thickness. A particularly suitable bath comprises silver nitrate ($AgNO_3$), buffered hydrofluoric acid, which is made up typically of about 30 percent ammonium bifluoride, about 60 percent water and the balance hydrofluoric acid of commercial grade (49 percent concentration) the foregoing percentages being by weight. The remainder of the bath is water. The bath concentration is adjusted in terms of the ratio of silver nitrate to buffered hydrofluoric acid. Advantageously, this ratio is maintained constant at a value of 2.5 grams per liter of silver nitrate to 10 cubic centimeters per liter of buffered hydrofluoric acid (49 percent concentration). By maintaining this ratio the concentration of silver nitrate may range from 0.01 to 0.05 molar. The bath is maintained at about room temperature, typically 25° to 30° centigrade. Depending on the concentration of the silver nitrate in inverse fashion the plating times range from about 10 minutes to about 1 minute. In one suitable embodiment a plating time of about two minutes produced a silver layer of about 0.5 microns thickness.

Following completion of the plating process the assembly is withdrawn, rinsed in high purity water and dried. After demounting the targets from the carrier they are washed in acetone and rinsed in deionized water followed by a spin drying process.

Figure 2:
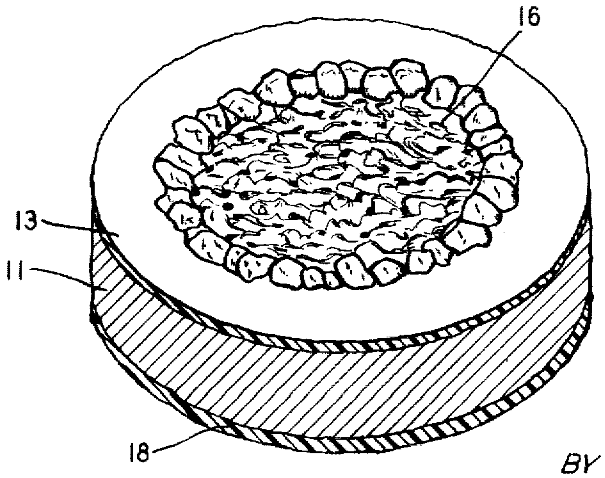
FIG. 2 is a perspective of a portion of the target structure showing a single conductive contact on the surface thereof.

Referring to FIG. 2 there is depicted the configuration of the silver contact 16 produced thereby. As represented in the drawing the overlay contact is comparatively rough and nodular in appearance as observed particularly through a scanning electron microscope. The structure is such as to suggest, based on initial visual observation, a poor electrical response as a consequence of such irregular configuration. However, upon testing, target arrays provided with silver buttons in accordance with this invention exhibit considerably improved electrical response including improved lag, resolution and signal capacity. As suggested hereinbefore, these enhanced properties appear to relate to the relatively discontinuous and irregular structure resulting from the plating process from the particular bath employed. As noted hereinbefore, this contact configuration has been characterized as nodular in appearance. Moreover, the particular plating process also contributes to the thickened, likewise nodular, peripheral portion of the contact which overlies the oxide film and which also is significant to the performance of the target. Moreover, suitable contact thicknesses are achieved in considerably shorter times than were heretofore achieved by prior art plating techniques.

As indicated in the copending application of E. I. Gordon referred to hereinbefore the invention is likewise applicable to other forms of the target structure as well as to the particular embodiment described herein. Thus, in addition to devices containing PN junction diode arrays the invention may be used with target arrays using MIS structures, Schottky-barrier devices, as well as barrier layer devices generally.

What is claimed is:

1. A target structure for an electron beam storage device comprising a semiconductive wafer the major portion of which is of a first conductivity type; the semiconductor wafer including on a first surface thereof an array of regions, each of the regions defining with the major portion of the wafer a PN junction; an array of metal contacts each of which is bonded to one of the regions of the second conductivity type; characterized in that said metal contacts are comprised of a discontinuous, nodular coating of silver produced by displacement plating from a silver nitrate and buffered hydrofluoric acid bath.

2. A target structure in accordance with claim 1 in which the array of regions on said first surface is defined by an insulating layer.

3. A target structure in accordance with claim 2 in which said metal contacts include a peripheral portion overlying said insulating film defining said regions.

4. A target structure in accordance with claim 3 in which said overlying portion of said metal contacts is of greater thickness than the remaining portion of said metal contacts and said overlying portion is of a nodular configuration.

* * * * *